US011322433B2

(12) United States Patent
Tuncer et al.

(10) Patent No.: US 11,322,433 B2
(45) Date of Patent: May 3, 2022

(54) HALL SENSOR PACKAGES

(71) Applicant: TEXAS INSTRUMENTS INCORPORATED, Dallas, TX (US)

(72) Inventors: Enis Tuncer, Dallas, TX (US); Alejandro Hernandez-Luna, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 87 days.

(21) Appl. No.: 16/842,567

(22) Filed: Apr. 7, 2020

(65) Prior Publication Data

US 2021/0313258 A1 Oct. 7, 2021

(51) Int. Cl.
*H01L 23/31* (2006.01)
*H01L 23/498* (2006.01)
*H01L 43/06* (2006.01)

(52) U.S. Cl.
CPC .... *H01L 23/49816* (2013.01); *H01L 23/3114* (2013.01); *H01L 23/49861* (2013.01); *H01L 43/06* (2013.01)

(58) Field of Classification Search
CPC ...................................................... H01L 43/08
See application file for complete search history.

(56) References Cited

U.S. PATENT DOCUMENTS

| 9,846,205 | B1* | 12/2017 | Sonntag | G01R 33/02 |
| 10,921,349 | B2* | 2/2021 | Dogiamis | G01R 15/205 |
| 2012/0126379 | A1* | 5/2012 | Uenda | H01L 21/6836 257/659 |
| 2015/0082856 | A1* | 3/2015 | Paci | G01K 13/00 73/1.01 |
| 2015/0171934 | A1* | 6/2015 | Brauchler | H01L 25/50 455/41.1 |
| 2017/0356968 | A1* | 12/2017 | Schaller | H01L 43/02 |
| 2021/0313258 | A1* | 10/2021 | Tuncer | H01L 23/49816 |

* cited by examiner

*Primary Examiner* — Thao P Le
(74) *Attorney, Agent, or Firm* — Dawn Jos; Charles A. Brill; Frank D. Cimino

(57) ABSTRACT

In some examples, a package comprises first and second terminals and a conductive pathway coupling the first and second terminals. The conductive pathway is configured to generate a magnetic field. The package comprises a conductive member aligned with and coupled to the conductive pathway. The conductive pathway and the conductive member have a common shape. The package also comprises an insulative layer coupled to the conductive member and a die coupled to the insulative layer and having a circuit configured to measure the magnetic field. The circuit faces the conductive pathway.

22 Claims, 11 Drawing Sheets

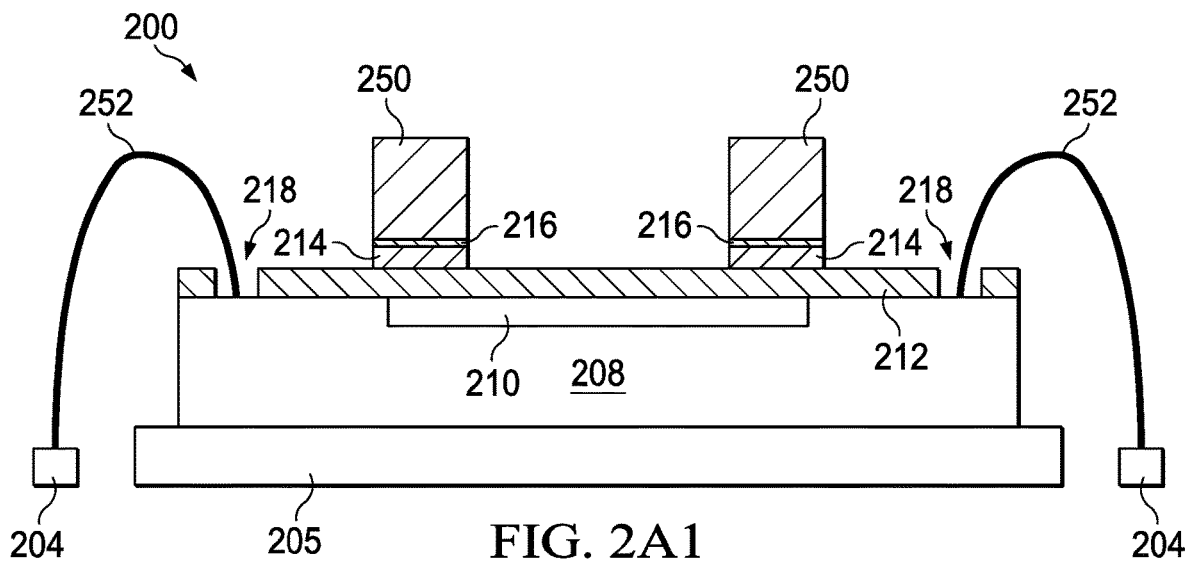
FIG. 2A1
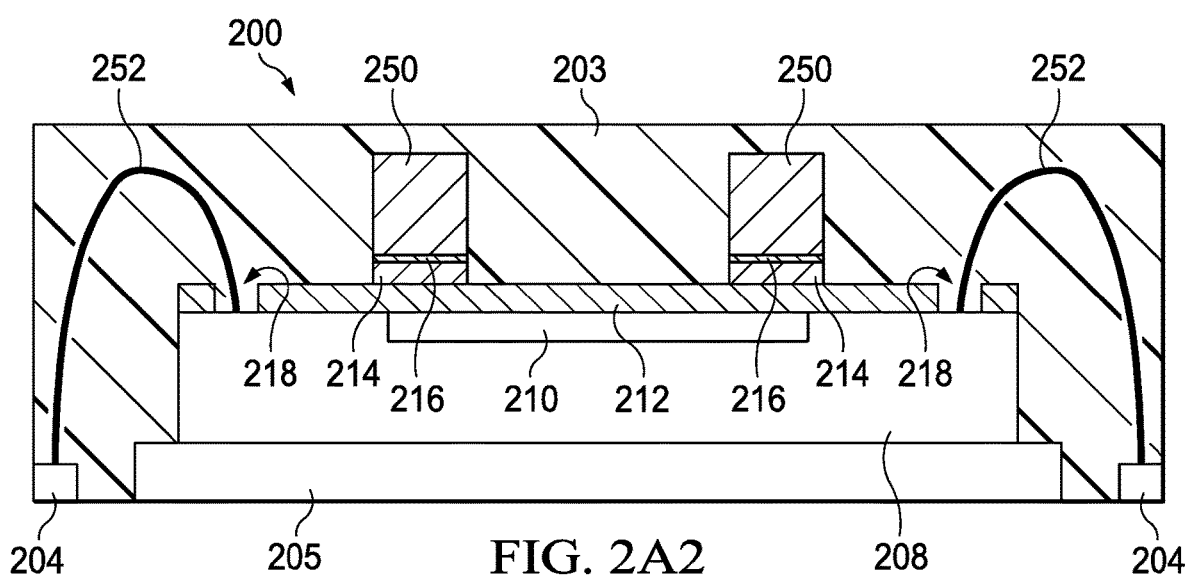
FIG. 2A2

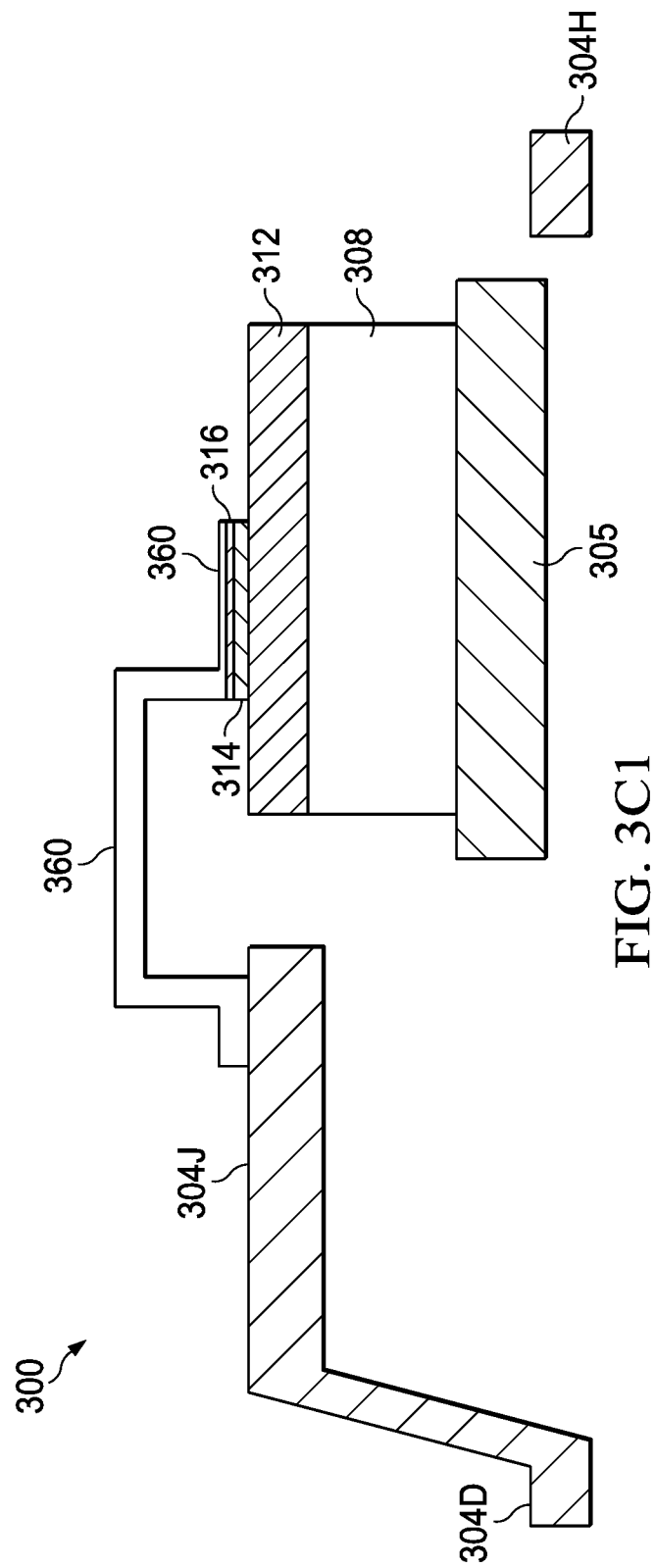
FIG. 3C1

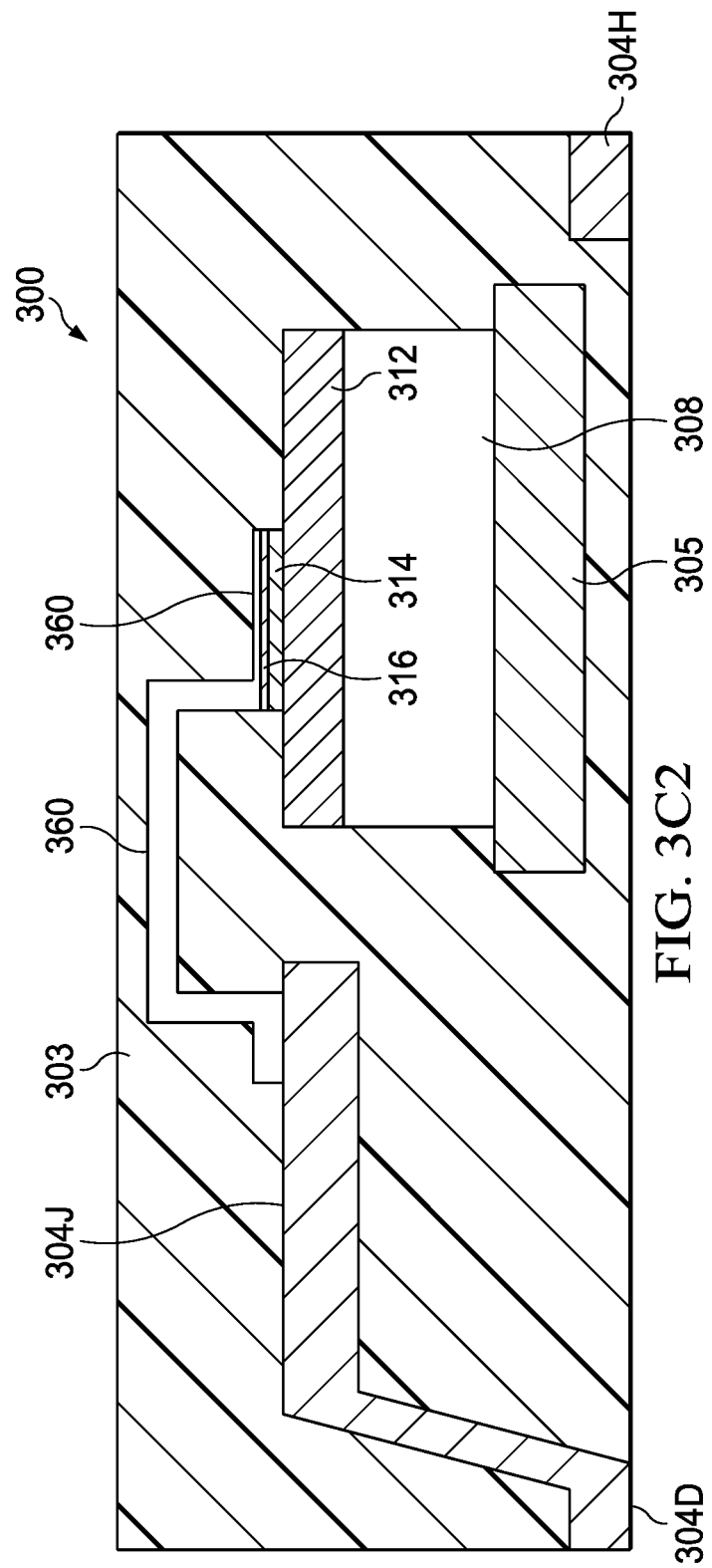
FIG. 3C2

HALL SENSOR PACKAGES

BACKGROUND

Hall sensors may be implemented in a variety of ways. In some cases, a Hall sensor package may include a pair of package leads connected via a conductive pathway. Current flowing through the conductive pathway generates a magnetic field. A die is positioned adjacent to the conductive pathway, and, more specifically, the die contains a circuit that is positioned within the magnetic field and that is able to measure the magnetic field. The measurement may then be used as desired, for example, to determine how much current is flowing through the conductive pathway.

SUMMARY

In some examples, a package comprises first and second terminals and a conductive pathway coupling the first and second terminals. The conductive pathway is configured to generate a magnetic field. The package comprises a conductive member aligned with and coupled to the conductive pathway. The conductive pathway and the conductive member have a common shape. The package also comprises an insulative layer coupled to the conductive member and a die coupled to the insulative layer and having a circuit configured to measure the magnetic field. The circuit faces the conductive pathway.

BRIEF DESCRIPTION OF THE DRAWINGS

For a detailed description of various examples, reference will now be made to the accompanying drawings in which:

FIGS. 2A1-2A2 are cross-sectional profile views of some of the contents of a wirebonded package in accordance with various examples.

FIG. 3C1-3C2 are additional profile views of some of the contents of a clip package in accordance with various examples.

DETAILED DESCRIPTION

In many Hall sensor packages, the space between the conductive pathway and the die is generally filled with a dielectric (e.g., underfill or mold compound). Due to physical limitations, this underfill or mold compound may contain air gaps. If the air gaps are in the critical area between the conductive pathway and the circuit of the die, the performance, integrity, and durability of the Hall sensor package can be compromised. As merely one example, air gaps (or "voids") in the underfill or mold compound result in high electric fields inside such gaps, which prematurely ages the mold compound and which comprises the functional integrity of the Hall sensor.

This disclosure describes a Hall sensor package that overcomes the disadvantages described above by eliminating the presence of air gaps between the conductive pathway and the circuit of the die. Such air gaps are eliminated by stacking on top of the conductive pathway a conductive member that is shaped similarly to the conductive pathway, and further by filling the space between the conductive member and the circuit on the die using an insulative material, such as a low-stress die coat layer. An underfill or mold compound may still be used to fill the space horizontally adjacent to the conductive member, but this underfill or mold compound is not positioned in between the conductive member and the circuit on the die. As a result, any air gaps that may exist in the underfill or mold compound are not positioned between the conductive member and the circuit on the die. Thus, the performance, integrity, and durability of the Hall sensor package is maintained, even if the MC contains air gaps or deteriorates over time.

Figure 1A:
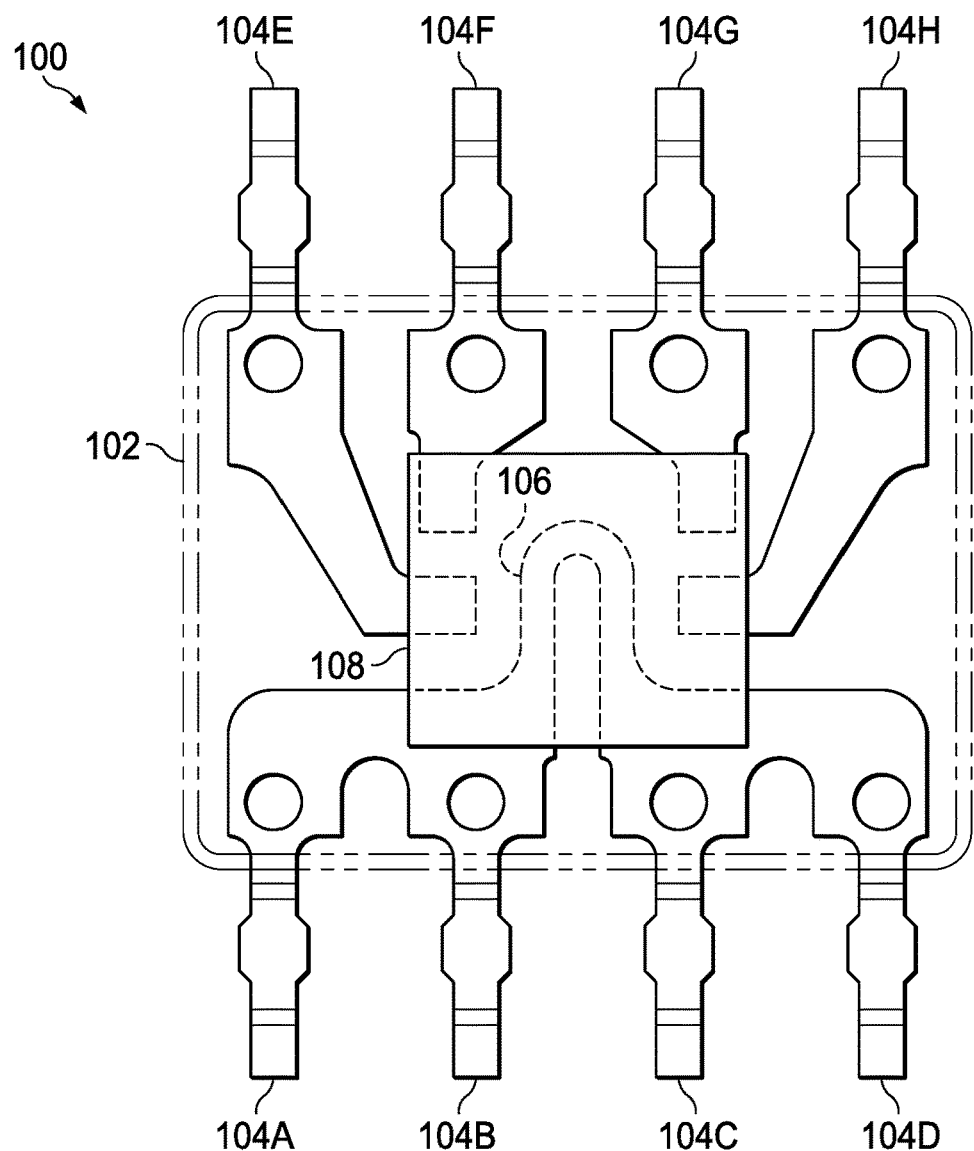
FIG. 1A is a top-down view of some of the contents of a flip-chip package in accordance with various examples.

FIG. 1A is a top-down view of some of the contents of a flip-chip package 100 in accordance with various examples. The illustrative package 100 comprises a molding 102 and a plurality of package terminals (e.g., leads) 104A-104H. The terminals 104A, 104B couple to each other, and the terminals 104C, 104D couple to each other. In some examples, the terminals 104A-104D are positioned along a same side of the package 100 and exposed to a common exterior surface of the package 100, and the terminals 104E-104H are positioned along a different side of the package 100 and exposed to a common exterior surface of the package 100. In addition, the pair of terminals 104A, 104B couples to the pair of terminals 104C, 104D via a conductive pathway 106. In some examples, the conductive pathway 106 has a curved shape, as FIG. 1A depicts. In some examples, the conductive pathway 106 is straight. In some examples, the conductive pathway 106 is angled. In some examples, the conductive pathway 106 couples a pair of terminals together. In other examples, such as that shown in FIG. 1A, the conductive pathway 106 couples multiple pairs of terminals together. In some examples, one or more of the terminals 104E-104H couples to another terminal 104E-104H, and in other examples, the terminals 104E-104H are independent of each other. The package 100 further includes a semiconductor die (also called a chip) 108 having circuitry (not expressly shown in FIG. 1A) formed thereupon, such as a Hall sensor circuit. In some examples, the die 108 is positioned adjacent to, but not physically contacting, the conductive pathway 106. Although the package 100 is depicted as being a flip-chip package, the scope of this disclosure is not limited to any particular type of package. The techniques described herein may be implemented in any of a variety of packages, including flip-chip packages, wafer chip scale packages (WCSP), ball grid array (BGA) packages, wire bonded packages, no-lead packages (e.g., quad flat no lead (QFN) packages), other types of packages, or a combination thereof.

Figure 1B:
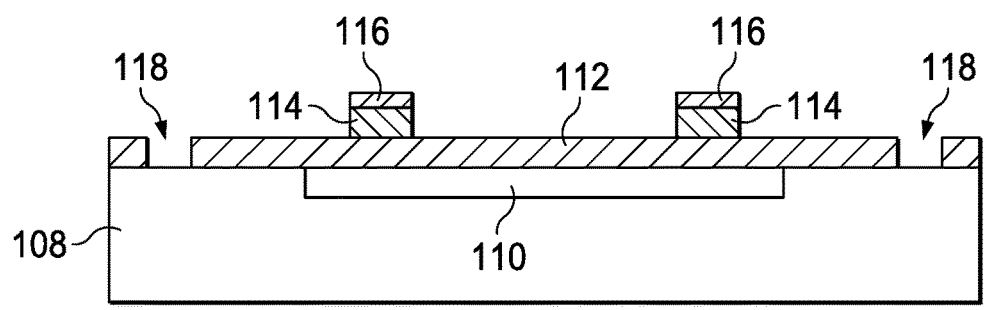
FIG. 1B is a cross-sectional profile view of some of the contents of a flip-chip package in accordance with various examples.

FIG. 1B is a cross-sectional profile view of some, but not necessarily all, of the contents of the flip-chip package 100 in accordance with various examples. The package 100 comprises a semiconductor die 108 having a circuit 110 formed thereupon. In some examples, the circuit 110 comprises a Hall sensor configured to, e.g., measure a magnetic field in which the circuit 110 is positioned. The package 100 further includes an insulative layer 112 abutting the die 108, including the circuit 110. In some examples, the insulative layer 112 couples to the die 108 using any suitable adhesive (e.g., solder). In some examples, the insulative layer 112 comprises a low-stress die coat. A low-stress die coat (e.g., polyimide, epoxy, etc.) is a material that does not stress the die to which it couples because of a low shrinkage (e.g., relative to polyimides with approximately 30% shrinkage) when cured, a low Young's modulus (e.g., less than 2 GPa), and a high coefficient of thermal expansion (e.g. larger than 20 um/K). As mentioned, these illustrative values may be used to avoid stressing the die. Examples of low-stress die coats include DMI 3005®, DMI 3006®, TORAY LTS8000®, FUJI FCPI-2100®, and HD7100®. In examples, the breakdown electric field for the low-stress die coat may be 2-to-3 times larger than that for the dielectric 120 (described below and shown in FIG. 1D). Such a material composition of the insulative layer 112 may be advantageous because it does not permit void formation and electrical aging via partial discharges. In some examples, the insulative layer 112 has a thickness ranging from 5 microns to 80 microns. This thickness range is advantageous because it provides a reliable, high-voltage operation from 500 V to 8 kV, for example, during stress testing. In some examples, the insulative layer 112 includes one or more orifices 118. These orifices may be circularly-shaped and have a diameter ranging from 1 micron to 900 microns, or they may have a rectangular shape and have width and length measurements ranging from 1 micron to 900 microns and 1 micron to 900 microns, respectively. Other shapes are contemplated and fall within the scope of this disclosure. In some examples, the orifices 118 are used to connect the die 108 to terminals (e.g., leads), for example, using pillars, bond wires, or other electrically conductive connections, as described below. The package 100 further includes a conductive member 114 that couples to the insulative layer 112 using, e.g., a bumping technique of a redistribution layer manufacturing process. The conductive member 114 is composed of any suitable metal or metal alloy, such as copper, gold, silver, aluminum, platinum, etc. Such materials may be advantageous because they are highly conductive metals. In some examples, the conductive member 114 and the conductive pathway 106 share a common shape. For example, as the conductive pathway 106 in FIG. 1A is curved, so too the conductive member 114 may be curved. In some examples, the conductive member 114 and the conductive pathway 106 share a common size. In some examples, the conductive member 114 is shaped and/or sized so that, when coupled to the conductive pathway 106, the conductive member 114 aligns with the conductive pathway 106. (By "align," it is meant that the conductive member 114 and the conductive pathway 106 have the same or similar size, shape, and position such that from a top-down view, only one of the two components is visible, and from a bottom-up view, only one of the two components is visible.) In some examples, the conductive member 114 has a thickness ranging from 1 micron to 10 microns. Such a range of thicknesses may be advantageous because they provide a path for current flow while limiting electromigration effects and providing sufficient electrical contact to solder layer 116. In some examples, a solder layer 116 abuts the conductive member 114 to facilitate coupling between the conductive member 114 and the conductive pathway 106.

Figure 1C:
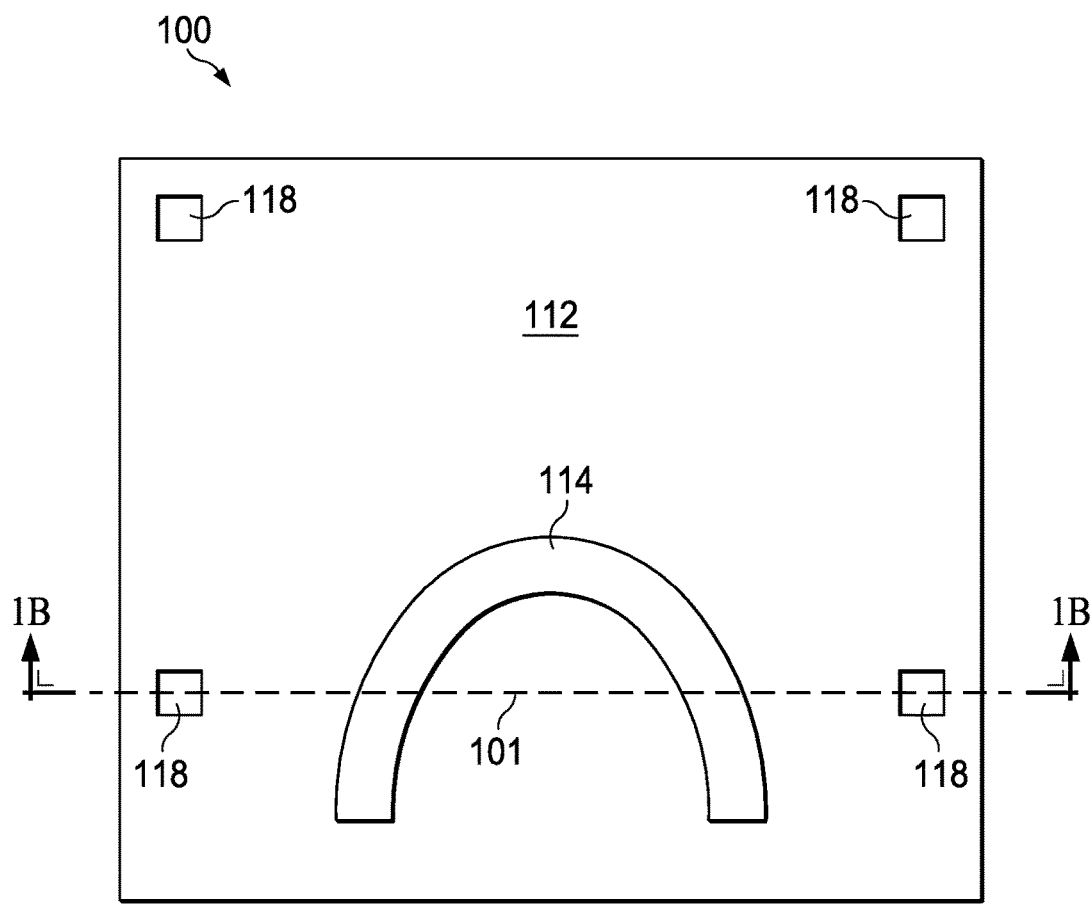
FIG. 1C is a top-down view of some of the contents of a flip-chip package in accordance with various examples.

FIG. 1C is a top-down view of some, but not necessarily all, of the contents of the flip-chip package 100 in accordance with various examples. FIG. 1C depicts the aforementioned insulative layer 112 having the conductive member 114 coupled thereto. The solder layer 116 shown in FIG. 1B is omitted from FIG. 1C. As shown, the conductive member 114 may have a curved shape, for example, a semi-circular shape or a semi-ovoid shape. The insulative layer 112 includes multiple orifices 118, as shown. Line 101 depicts the cut at which the cross-section of FIG. 1B is taken.

Figure 1D:
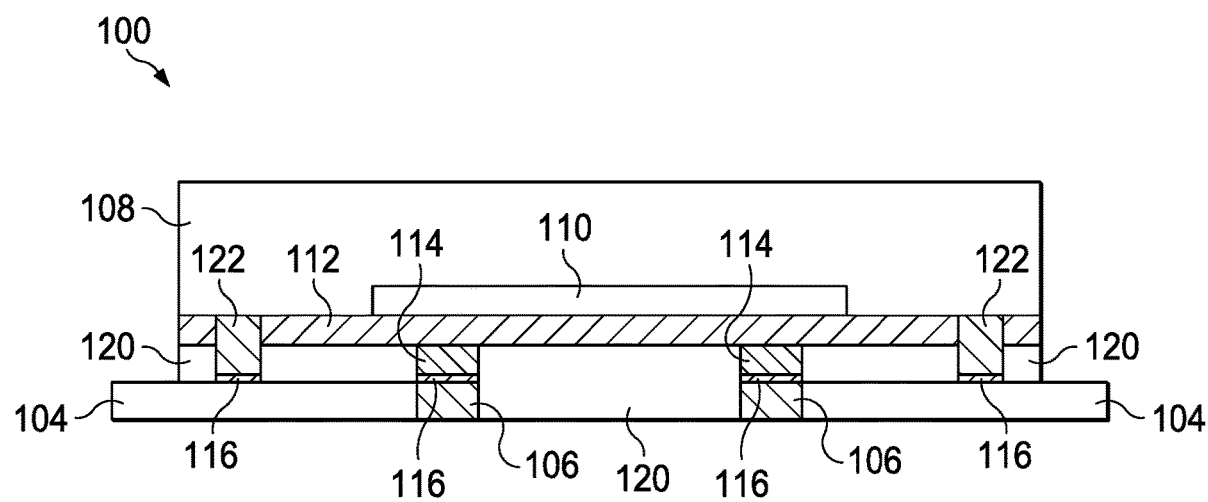
FIG. 1D is a cross-sectional profile view of some of the contents of a flip-chip package in accordance with various examples.

FIG. 1D is a cross-sectional profile view of some, but not necessarily all, of the contents of the flip-chip package 100 in accordance with various examples. In FIG. 1D, the assembly depicted in FIG. 1B is flipped and mounted onto a support member 104. In examples, the support member 104 is a lead frame (e.g., leads of a lead frame after trimming of the lead frame, such as the leads shown in FIG. 1A). In examples, the support member 104 is a printed circuit board (PCB). Other substrates are contemplated and included within the scope of this disclosure. The solder layer 116 is used to couple the conductive member 114 to the conductive pathway 106, which is part of the support member 104. The die 108 couples to the support member 104 (e.g., to individual leads or groups of leads) via pillars 122 in the orifices 118 (FIGS. 1B, 1C). For example, one or more pillars 122 may couple to one or more of the leads 104E-104H (FIG. 1A). The pillars 122 may couple the support member 104 to, for example, active circuitry on the die 108. Solder layers 116 may be used to establish such couplings.

Still referring to FIG. 1D, the package 100 additionally may include a dielectric layer 120 (e.g., underfill/mold compound). The thickness of the layer 120 is determined by the available space between the insulative layer 112 and the die 104, and thus may be any suitable thickness value. The layer 120 may include air gaps or other imperfections that would result in the disadvantages described above in structures not employing the techniques described herein. However, the structure of the package 100 mitigates those disadvantages. Specifically, when current flows through the conductive pathway 106 (e.g., as applied to terminals 104A, 104B and as output by terminals 104C, 104D in FIG. 1A), a magnetic field is generated. In other packages, the air gaps and other imperfections in the layer 120 would interfere with the functional integrity of the Hall sensor in the circuit 110. However, in the package 100, the solder layer 116 and the conductive member 114 are both conductive and are coupled to the conductive pathway 106. As a result, the aforementioned current flows through the conductive pathway 106, the solder layer 116, and the conductive member 114. In examples, the insulative layer 112 abuts the conductive member 114, and no air gaps are present in the insulative layer 112. In addition, in examples, the circuit 110 abuts the insulative layer 112. As a result, the magnetic field is generated by the current flowing through the conductive stack formed by the conductive pathway 106, the solder layer 116, and the conductive member 114, and with no air gaps present in the insulative layer 112, the path between the magnetic field and the circuit 110 is unobstructed by the layer 120 or by air gaps in the layer 120. Thus, the disadvantages of other packages are mitigated by the package 100.

Figure 1E:
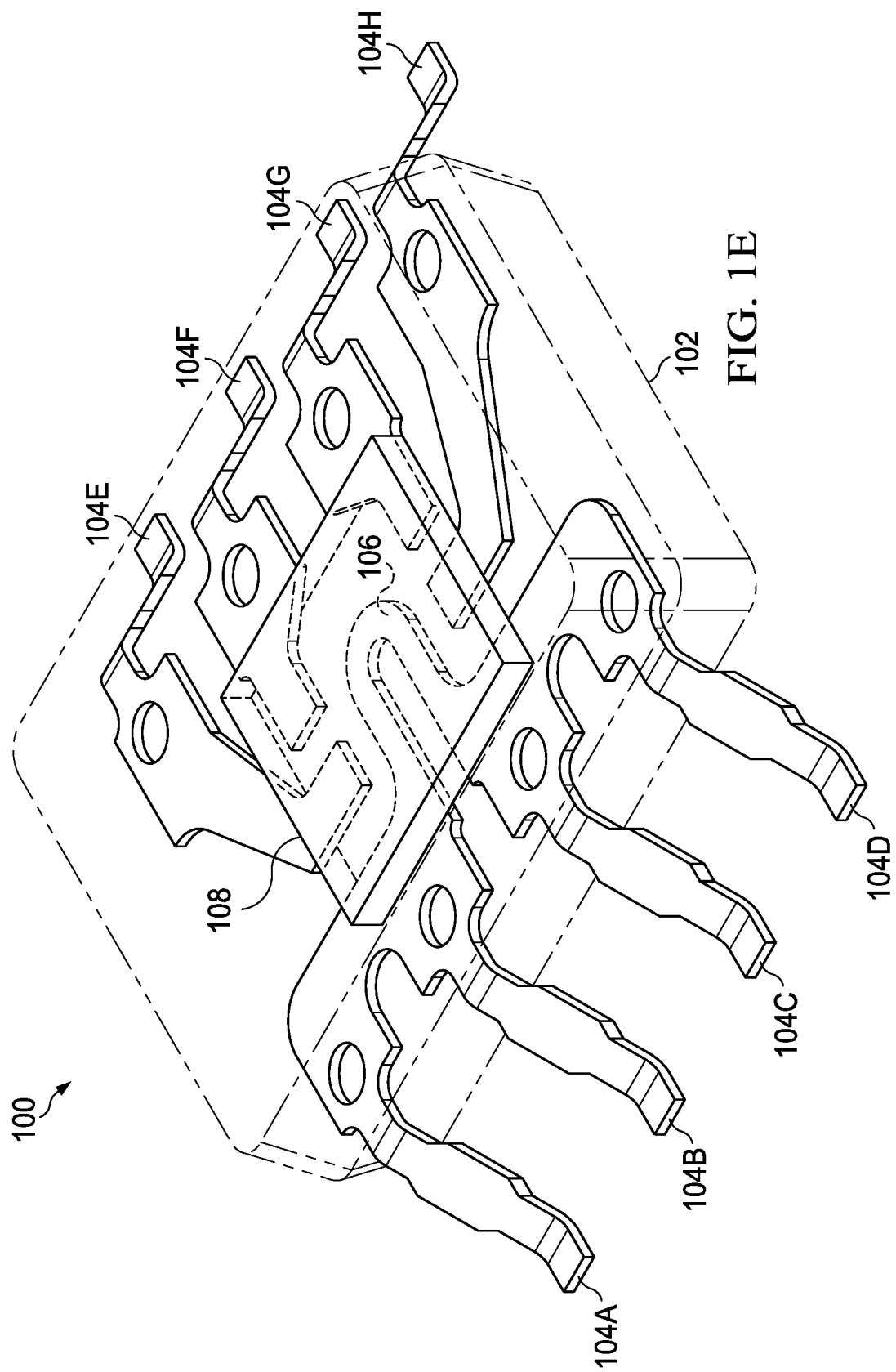
FIG. 1E is a perspective view of some of the contents of a flip-chip package in accordance with various examples.

Referring still to FIG. 1D, the package 100 may be manufactured by producing a lead frame strip (using any suitable technique, such as stamping) that includes the features described above for the support member 104. If a support member other than a lead frame is used, for example a PCB, that support member may likewise be manufactured using any suitable technique. The die 108, including the circuit 110, may similarly be manufactured using any suitable technique. The insulative layer 112 is deposited on the die 108, for example using a printing technique or a spin coating technique. A photolithography process using suitable photoresists, masks and etchants may be used to form the orifices 118, which may then be filled using any suitable conductive material to form the pillars 122. The pillars 122 may be filled, for example, using a photolithography process using suitable photoresists, masks and etchants. The assembly including the die 108, the insulative layer 112, and the pillars 122 may then be flipped and mounted to the support member 104. In some examples, the conductive member 114 is formed on the insulative layer 112 (e.g., using a photolithography technique) prior to mounting the die 108 to the support member 104. In some examples, the conductive member 114 is formed on the conductive pathway 106 (with the solder layer 116 positioned therebetween) prior to mounting the die 108 to the support member 104. After the die 108 is mounted to the support member 104, the layer 120 may be applied (e.g., injected) into the space between the insulative layer 112 and the support member 104. FIG. 1E provides a perspective view of some of the aforementioned contents of the flip-chip package 100 in accordance with various examples.

Figure 2B:
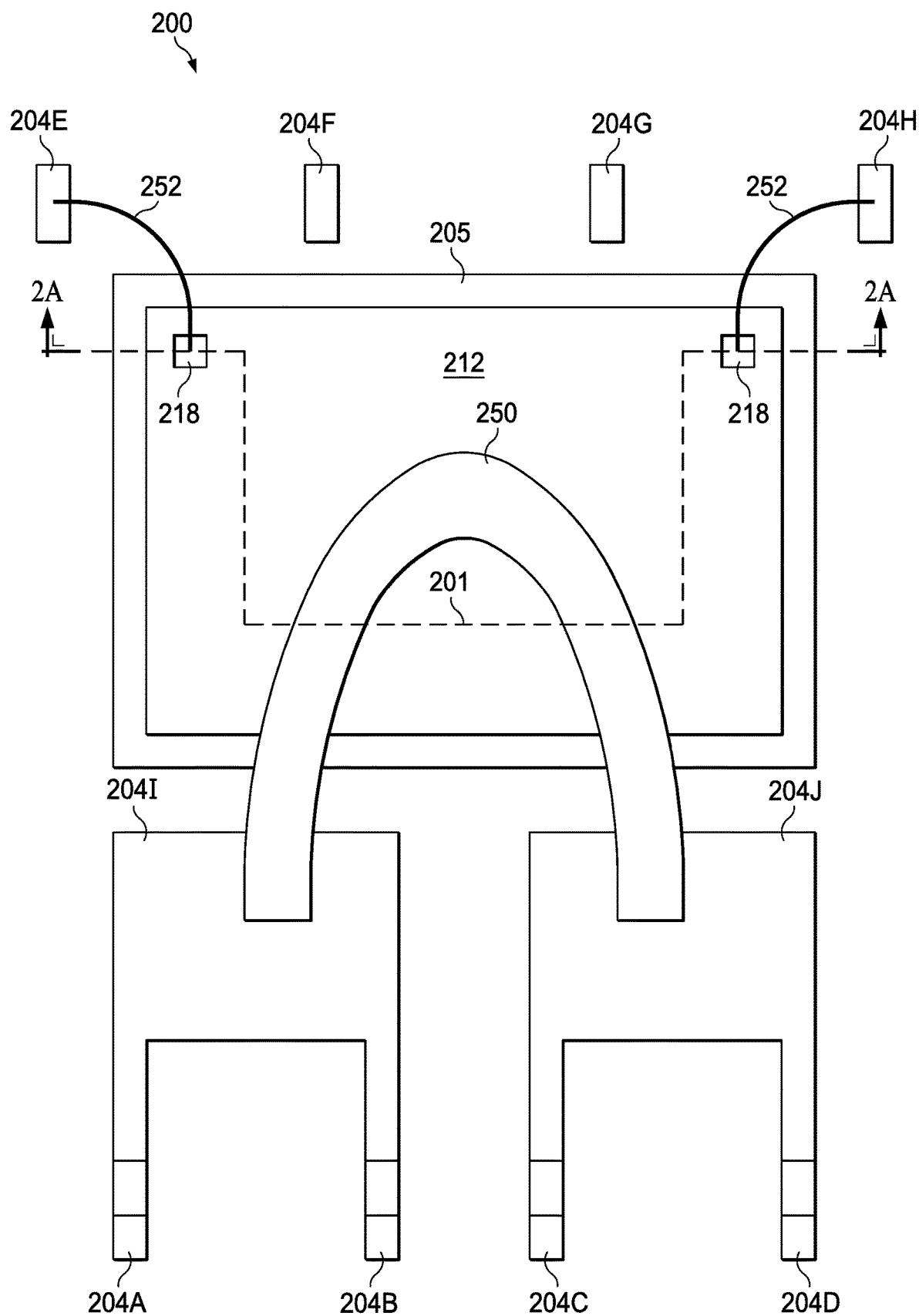
FIG. 2B is a top-down view of some of the contents of a wirebonded package in accordance with various examples.

FIG. 2A1 is a cross-sectional profile view of some of the contents of a wirebonded package 200 in accordance with various examples. The package 200 includes a die pad 205 (e.g., a die pad trimmed from a lead frame strip prior to inclusion in the package 200) and a semiconductor die 208 mounted on the die pad 205. The die 208 includes a circuit 210, such as a Hall sensor circuit configured to measure a magnetic field in which the circuit 210 is positioned. The package 200 further comprises an insulative layer 212 coupled to the circuit 210. In some examples, the insulative layer 212 is composed of a low-stress die coat (as described above) and couples to the die 208 using any suitable adhesive, e.g., solder. In some examples, the thickness of the insulative layer 212 ranges from 1 micron to 900 microns. This range of thicknesses is advantageous because it provides a reliable, high-voltage operation from 500 V to 8 kV, for example during a stress test. The insulative layer 212 comprises orifices 218, which in some examples are circular and have diameters ranging from 1 micron to 900 microns, and which in some examples are rectangular and have widths and lengths ranging from 1 micron to 900 microns and 1 micron to 900 microns, respectively. Terminals 204 (e.g., leads) couple to the die 208 via bond wires 252, as shown. In some examples, the terminals 204 and the bond wires 252 are set posterior to the cross-sectional cut depicted in FIG. 2A1 (as indicated by line 201 in FIG. 2B) and thus are not truly part of the cross-sectional view of the package 200, but they are nevertheless shown in FIG. 2A1 to provide a clearer understanding of the structure of the package 200. In examples, the terminals 204 are exposed to an exterior surface of the package 200, for instance, an exterior surface of a molding of the package 200.

Still referring to FIG. 2A1, the package 200 further comprises a conductive member 214 coupled to the insulative layer 212 using, e.g., a bumping technique of a redistribution layer manufacturing process. In some examples, the conductive member 214 has the same or similar properties (e.g., shape, dimensions, material composition) as the conductive member 114 described above, and these properties provide the same advantages as those described above. The package 200 also includes a conductive pathway 250 coupled to the conductive member 214 via a solder layer 216. In some examples, the conductive pathway 250 has the same or similar properties (e.g., shape, dimensions, and/or material composition) as the conductive pathway 106 described above, and these properties provide the same advantages as those described above. In some examples, the conductive pathway 250 and the conductive member 214 share a common shape. In some examples, the conductive pathway 250 and the conductive member 214 share a common size. In some examples, the conductive pathway 250 is positioned above the conductive member 214, unlike the package 100, in which the conductive member 114 is positioned above the conductive pathway 106. This is because the package 200, at least as depicted in FIG. 2A1, is not a flip-chip package. The scope of this disclosure is not limited as such, however, and the package 200 may be any suitable type of package, including the package types listed above with respect to FIGS. 1A-1E. FIG. 2A2 depicts the structure of FIG. 2A1 covered by a mold compound 203.

FIG. 2B is a top-down view of some of the contents of the wirebonded package 200, in accordance with various examples. (The cross-section of FIG. 2A1 is taken along line 201.) Specifically, FIG. 2B depicts the insulative layer 212 positioned above the die pad 205. The insulative layer 212 includes a plurality of orifices 218 through which terminals 204E-204H couple to the die 208 using bond wires 218. The conductive pathway 250 is positioned above the insulative layer 212, with the conductive member 214 (not visible in FIG. 2B) positioned in between the conductive pathway 250 and the insulative layer 212. One end of the conductive pathway 250 couples to a pair of terminals (e.g., leads) 204A, 204B at a common conductive pad 204I, and the other end of the conductive pathway 250 couples to another pair of terminals (e.g., leads) 204C, 204D at a common conductive pad 204J. The terminals 204A-204D and 204E-204H may be exposed to opposing exterior surfaces of the package 200.

Figure 2C:
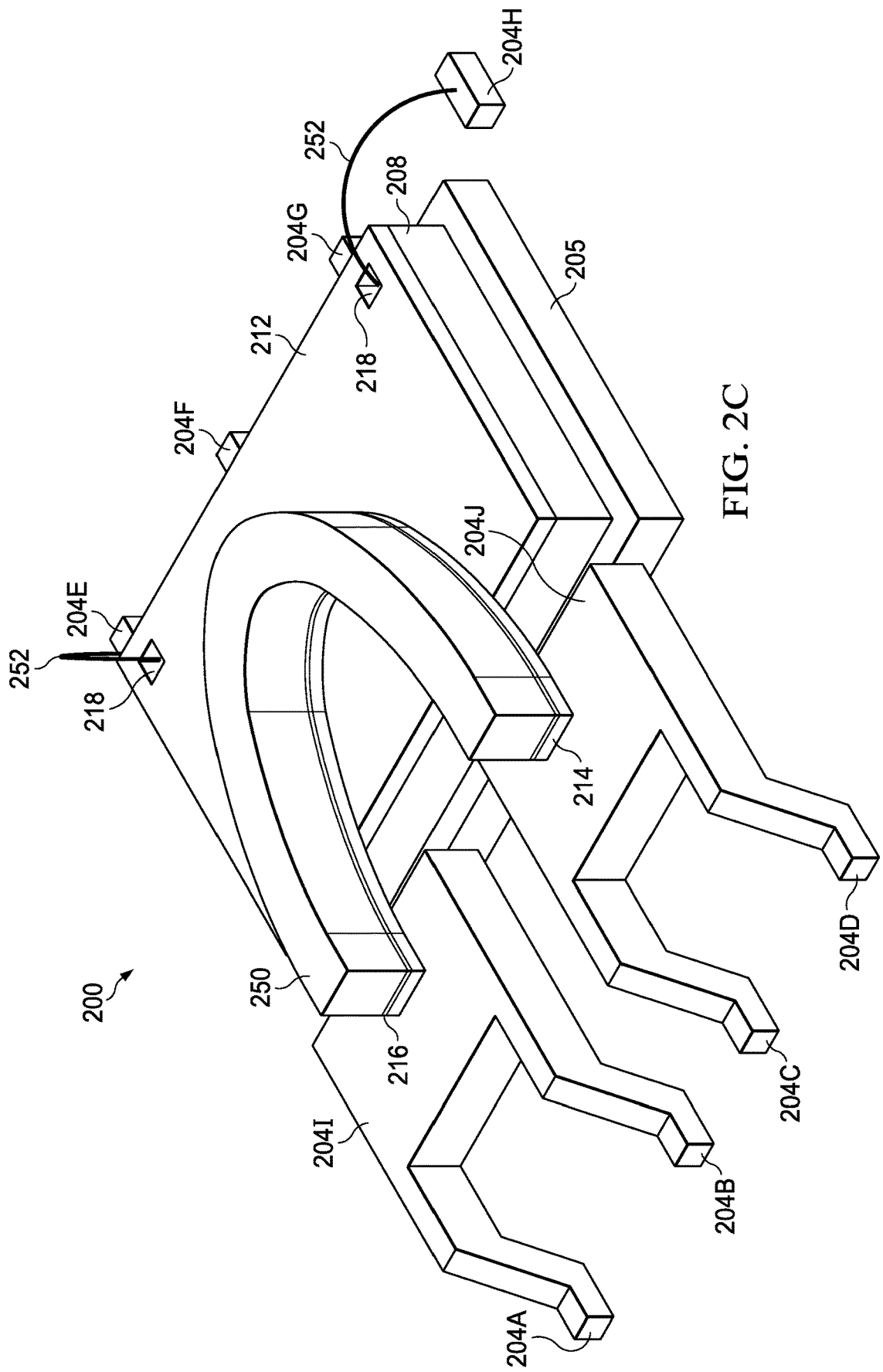
FIG. 2C is a perspective view of some of the contents of a wirebonded package in accordance with various examples.

The package 200 may be manufactured as follows. The die 208 (including the circuit 210), the insulative layer 212 (including the orifices 218), and the conductive member 214 may be manufactured using the techniques described above for corresponding components in package 100. In some examples, the conductive pathway 250 may be manufactured as part of the lead frame strip from which the terminals 204A-204H are trimmed, for example using a stamping process. In some examples, the conductive pathway 250 is separately manufactured using any suitable technique and subsequently is coupled (e.g., soldered) to the conductive member 214 and the common conductive pads 204I, 204J. FIG. 2C is a perspective view of some of the contents of the wirebonded package 200 in accordance with various examples. The package 200 may contain a dielectric (e.g., mold compound) layer containing air gaps that abuts the conductive pathway 250 and the conductive member 214, but such a layer would not be positioned between the stack (including the conductive pathway 250, the solder layer 216, and the conductive member 214) and the circuit 210 due to the insulative layer 212. Thus, as with the package 100, the package 200 mitigates the disadvantages described above.

Figure 3A:
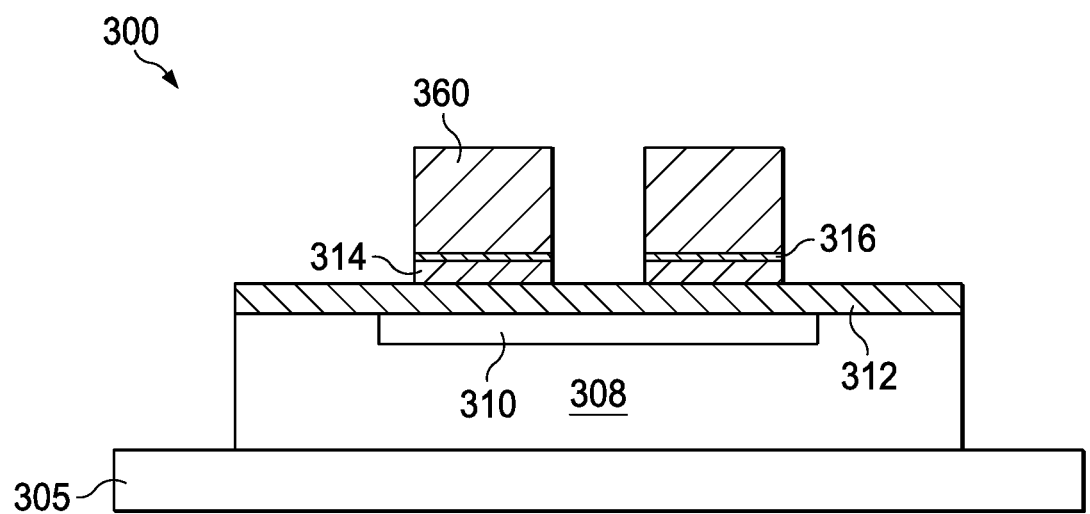
FIG. 3A is a cross-sectional profile view of some of the contents of a clip package in accordance with various examples.

FIG. 3A is a cross-sectional profile view of some of the contents of a clip package 300 in accordance with various examples. (A "clip," in this disclosure, refers to a conductive metal or metal alloy component that is not a bond wire and that extends in multiple planes as it couples two or more other components to each other.) The package 300 may be, for example, a wirebonded package that includes one or more clips. As FIG. 3A depicts, the package 300 may include a semiconductor die 308 mounted on a die pad 305. The die 308 includes a circuit 310, such as a Hall sensor circuit configured to measure a magnetic field in which the circuit 310 is positioned.

Figure 3B:
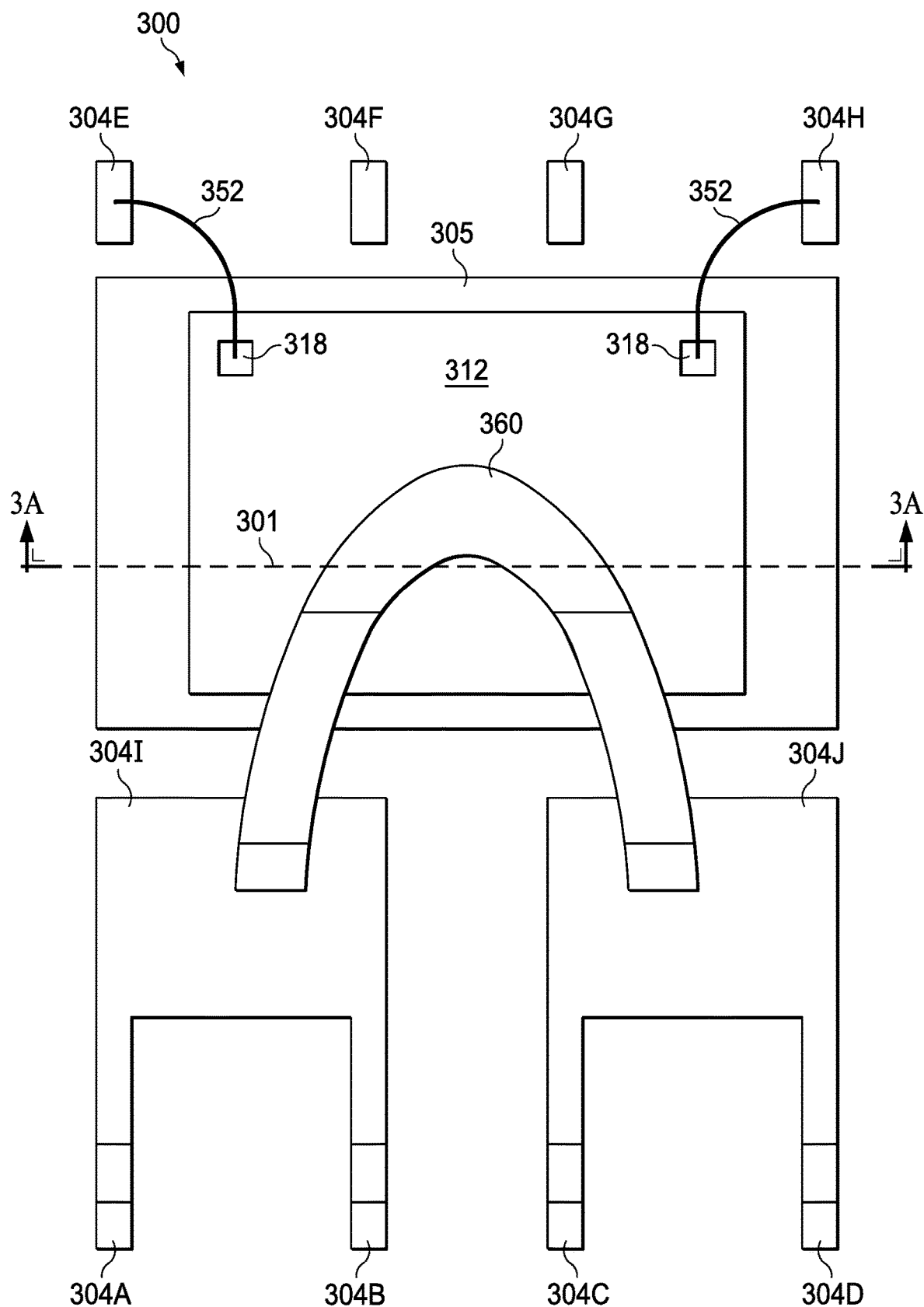
FIG. 3B is a top-down view of some of the contents of a clip package in accordance with various examples.

The package 300 further comprises an insulative layer 312 coupled to the die 308 using any suitable adhesive, e.g., solder. The insulative layer 312 may have properties (e.g., shape, dimensions, materials of composition) that are the same as or similar to those of the insulative layers 112, 212, described above. In some examples, the insulative layer 312 has a plurality of orifices through which bond wires may pass, as described below and as depicted in FIG. 3B (orifices 318). A conductive member 314 couples to the insulative layer 312 using, e.g., bumping technique of a redistribution layer process. The conductive member 314 may have properties (e.g., shape, dimensions, and/or materials of composition) that are the same as or similar to those of the conductive members 114, 214, and these properties may provide advantages similar to those described above. The package 300 further comprises a conductive pathway 360 (also referred to herein as a clip) coupled to the conductive member 314 using, e.g., a solder layer 316. The clip 360 may comprise, e.g., a similar material composition as the conductive pathway 250, and such a material composition may provide the same advantages as described above. Example dimensions of the clip 360 are described below with respect to FIG. 3C1.

FIG. 3B is a top-down view of some of the contents of the clip package 300 in accordance with various examples. (The cross-sectional view of FIG. 3A is taken along line 301.) As shown, the package 300 comprises the insulative layer 312 positioned above the die pad 305. The insulative layer 312 includes a plurality of orifices 318 through which package terminals (e.g., leads) 304E-304H may couple to the die 308 via bond wires 352. The clip 360 is positioned above the insulative layer 312 as shown, with one end of the clip 360 coupled to a pair of package terminals (e.g., leads) 304A, 304B via a common conductive pad 304I, and the other end of the clip 360 coupled to another pair of package terminals (e.g., leads) 304C, 304D via a common conductive pad 304J. In some examples, the terminals 304A-304D are exposed to a common exterior surface of the package 300, and the terminals 304E-304H are exposed to another common exterior surface of the package 300.

Figure 3D:
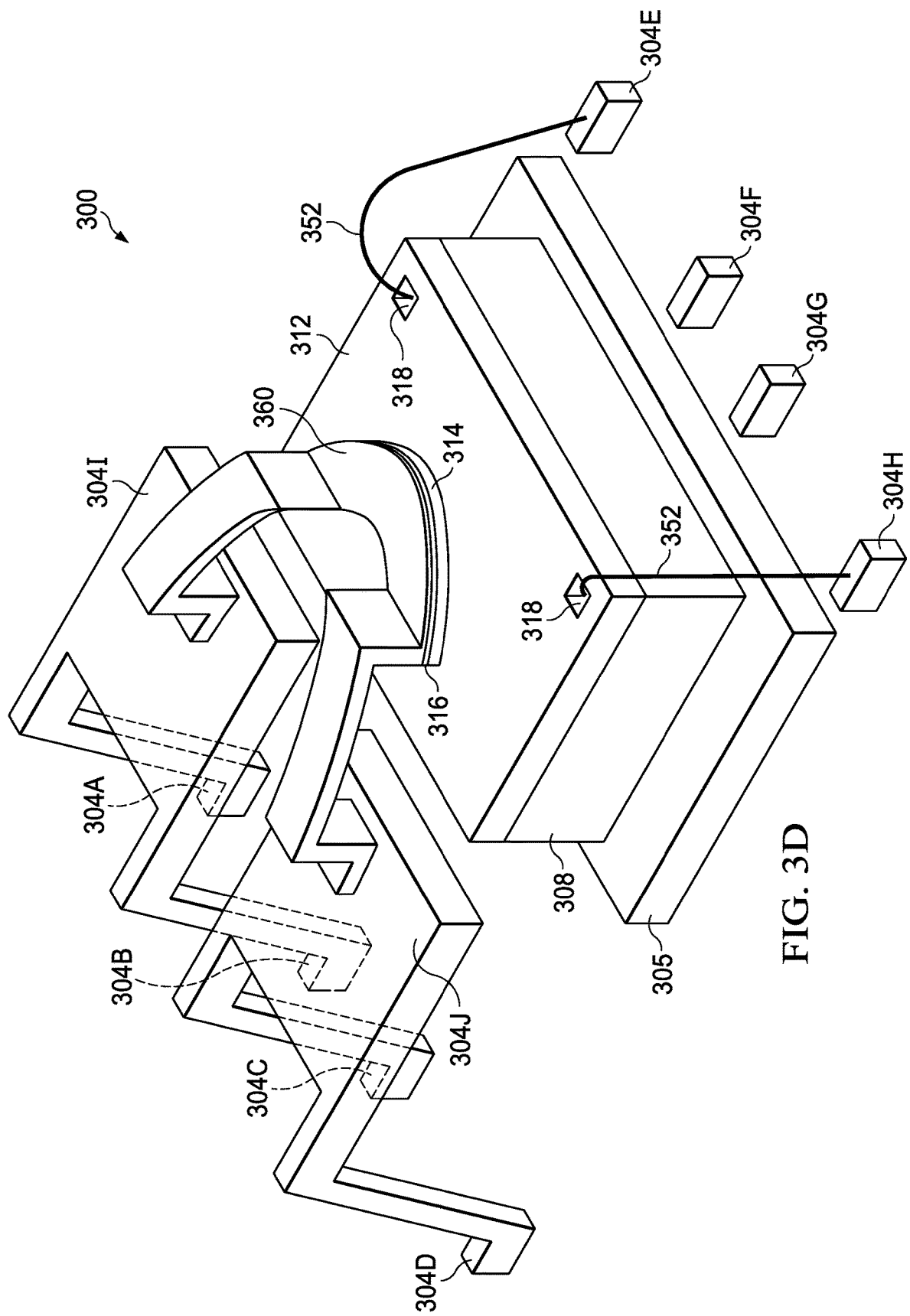
FIG. 3D is a perspective view of some of the contents of a clip package in accordance with various examples.

FIG. 3C1 is another profile view of some of the contents of the clip package 300 in accordance with various examples. (FIG. 3C2 depicts the structure of FIG. 3C1 covered by a mold compound 303.) As shown, the terminal 304D couples to the common conductive pad 304J, which, in turn, couples to the clip 360. The clip 360 also couples to the conductive member 314 via a solder layer 316. The conductive member couples to the insulative layer 312, which, in turn, couples to the die 308. The die 308 is positioned above the die pad 305, as shown. FIG. 3D is a perspective view of some of the contents of the clip package 300 in accordance with various examples.

In examples, the clip 360 has a total length ranging from 1 millimeter to 90 millimeters. In examples, the clip 360 has a total width ranging from 1 millimeter to 90 millimeters. In examples, the clip 360 has a total height ranging from 1 millimeter to 90 millimeters. Such ranges may be beneficial because they cover a wide variety of electrical current sensing applications in various package sizes. In at least some examples, the clip 360 has a same shape as the conductive member 314 in at least one dimension, e.g., in the Z axis view featured in the top-down view of FIG. 3B.

The package 300 may be manufactured using, e.g., the manufacturing techniques described above for package 200. As with the package 200, a dielectric (e.g., mold compound) layer may be applied abutting, e.g., the conductive pathway 360 and/or the conductive member 314. However, any such dielectric layer—including air gaps in the layer—would not be positioned between the stack (including the conductive pathway 360, the solder layer 316, and the conductive member 314) and the circuit 310, due at least in part to the position of the insulative layer 312.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A package, comprising:
   first and second terminals;
   a conductive pathway coupling the first and second terminals, the conductive pathway configured to generate a magnetic field;
   a conductive member aligned with and coupled to the conductive pathway, the conductive pathway and the conductive member having a common shape;
   an insulative layer coupled to the conductive member; and
   a die coupled to the insulative layer and having a circuit configured to measure the magnetic field, the circuit facing the conductive pathway.

2. The package of claim 1, further comprising a dielectric layer abutting the conductive member and the insulative layer.

3. The package of claim 2, wherein the dielectric layer comprises an underfill material or a mold compound material.

4. The package of claim 1, wherein the conductive pathway and the conductive member are curved.

5. The package of claim 1, wherein the first and second terminals are exposed to an exterior surface of the package along a same side of the package.

6. The package of claim 1, wherein the insulative layer comprises a low-stress die coat layer.

7. The package of claim 1, wherein the conductive pathway couples to a support member, wherein the support member is selected from the group consisting of a lead frame and a printed circuit board.

8. The package of claim 1, wherein the package is selected from the group consisting of a wafer chip scale package (WCSP) and a ball grid array package (BGA).

9. The package of claim 1, further comprising another conductive member coupling the circuit to a third terminal of the package.

10. A package, comprising:
a die pad;
a die positioned on the die pad, the die having a circuit facing away from the die pad and configured to measure a magnetic field;
an insulative layer positioned on the circuit;
a conductive member coupled to the insulative layer;
a conductive pathway configured to generate the magnetic field and aligned with and coupled to the conductive member; and
first and second terminals coupled to the conductive pathway.

11. The package of claim 10, further comprising a mold compound layer abutting the conductive pathway.

12. The package of claim 10, wherein the first and second terminals are exposed to an exterior surface of the package on a same side of the package.

13. The package of claim 10, wherein the conductive member and the conductive pathway have a common shape.

14. The package of claim 13, wherein the common shape is a curved shape.

15. The package of claim 10, wherein the insulative layer comprises a low-stress die coat layer.

16. A package, comprising:
a die having a circuit configured to measure a magnetic field;
an insulative layer abutting the circuit;
a conductive member abutting the insulative layer;
a clip coupled to the conductive member, the clip and the conductive member having a common shape in at least one dimension; and
first and second terminals coupled to the clip.

17. The package of claim 16, wherein the first and second terminals are exposed to a common surface of the package.

18. The package of claim 16, wherein the insulative layer comprises a low-stress die coat layer.

19. The package of claim 18, wherein the low-stress die coat layer includes an orifice via which the circuit on the die couples to a third terminal of the package.

20. The package of claim 16, wherein the clip has a curved shape.

21. A system, comprising:
a package, comprising:
a semiconductor die having a circuit configured to measure a magnetic field;
a low-stress die coat coupled to the circuit;
a conductive member coupled to the low-stress die coat; and
a first terminal, a second terminal, and a conductive pathway coupled between the first and second terminals, the conductive pathway coupled to the conductive member and sharing a common shape with the conductive member.

22. The system of claim 21, further comprising a printed circuit board (PCB) having a conductive pathway that has a same shape as the conductive member and that is coupled to the conductive member.

* * * * *